United States Patent [19]
Aksyuk et al.

[11] Patent Number: 5,994,159
[45] Date of Patent: Nov. 30, 1999

[54] SELF-ASSEMBLYING MICRO-MECHANICAL DEVICE

[75] Inventors: Vladimir A. Aksyuk, Piscataway; David J. Bishop, Summit, both of N.J.

[73] Assignee: Lucent Technologies, Inc., Murray Hill, N.J.

[21] Appl. No.: 08/997,175

[22] Filed: Dec. 22, 1997

[51] Int. Cl.⁶ .......................... H01L 21/00; H01L 29/82; G01P 15/00
[52] U.S. Cl. .......................... 438/52; 257/415; 73/514.29
[58] Field of Search ................................ 257/415; 438/52; 73/514.29

[56] References Cited

U.S. PATENT DOCUMENTS

| 5,867,297 | 2/1999 | Kiang et al. | 359/198 |
|---|---|---|---|
| 5,912,094 | 6/1999 | Aksyuk et al. | 430/5 |

OTHER PUBLICATIONS

Cowan et al., "Vertical Thermal Actuators for Micro–Electro–Mechanical Systems," v.3226, SPIE, pp. 137–146, 1997.

Reid et al., "Automated Assembly of Flip–Up Micromirrors," Transducers '97, Proc. Int'l Conf. Solid–State Sensors and Actuators, Chicago, pp. 347–350, Jun. 1997.

Cowan et al., "Vertical Thermal Actuators for Micro–Optolectro–Mechanical Systems," v. 3226 S.P.I.E. pp. 137–46 (1997).

Reid et al., "Automated Assembly of Flip–Up Micromirrors," Transducers '97, Proc. Int'l Conf. Solid–State Sensors and Actuators, Chicago Jun. 16–19, 1997, pp. 347–350.

*Primary Examiner*—Brian Dutton

[57] ABSTRACT

A self-assembling micron-sized mechanical device is described. The device comprises hinged plates attached to a support. A beam having a first end free to move in an upwardly-directed arc is associated with each hinged plate comprising the device. The beam has a first engagement member, including a first angled edge, disposed at its freely-movable first end. Each hinged plate includes a second engagement member, including a second angled edge. In the unassembled state, at least a portion of the first engagement member lies beneath the second engagement member on the support. Actuation force is applied to the beam by an actuator, the force causing the first end of the beam to lift. As it does so, the first and second angled edges slide over another, and the hinged plate is rotated upwardly about its hinges away from the support. The mechanical advantage provided by the angled edges allows a hinged plate to be rotated fully ninety degrees away from the support.

20 Claims, 4 Drawing Sheets

SELF-ASSEMBLYING MICRO-MECHANICAL DEVICE

FIELD OF THE INVENTION

The present invention relates generally to micro-mechanical devices. More particularly, the present invention relates to self-assembling micron-sized mechanical devices.

BACKGROUND OF THE INVENTION

In a significant advance in micro-mechanical device technology, a micron-sized hinge was developed. The hinge, which can be used for forming hinged plates, has provided the art with a means for fabricating complex micro-electro-mechanical systems (MEMS) and micro-opto-electro-mechanical systems (MOEMS) devices. Presently, micron-sized analogs of many macro-scale devices can be fabricated. Applications of MEMS and MOEMS include, for example, data storage devices, laser scanners, printer heads, magnetic heads, micro-spectrometers, scanning-probe microscopes, near-field optical microscopes, optical scanners, optical modulators, micro-lenses, optical switches, and micro-robotics.

Forming a MEMS or MOEMS device begins with patterning hinged plates in appropriate locations on a substrate. As patterned, the various hinged plates lie flat on top of the substrate. Assembling the device involves lifting the unhinged end of each plate off of the substrate. For many devices, assembly requires that the hinged plates are placed in a substantially perpendicular orientation relative to the substrate.

An operator can assemble MEMS and MOEMS devices using a microprobe station to lift the various hinged plates into their required position. But, manual assembly of a large number of such devices, or even a single complex device, is impractical for commercial scale operation. Manual assembly of such devices limits the utility of the technology to little more than a laboratory curiosity.

Coupling actuators with micro-mechanical devices allows for automated assembly. A typical assembly system uses a "vertical" actuator that imparts an upwardly-directed force to lift a hinged plate off of the substrate. One such actuator is described by Cowan et al. in "Vertical Thermal Actuator for Micro-Opto-Electro-Mechanical Systems," v.3226, SPIE, pp. 137–46 (1997). Conventional actuators, such as described by Cowan et al., are limited in their usefulness, however, because they cannot rotate or lift hinged plates substantially more than forty-five degrees out of plane in a single actuation step. Nor has it been possible to achieve lift angles substantially greater than forty-five degrees only using an assembly motor.

Lift angles substantially greater than forty-five degrees are achieveable with a dual-stage assembly system. A dual-stage assembly system typically consists of a vertical actuator and an assembly motor. The vertical actuator lifts the hinged micro-mechanical device off of the substrate to a maximum angle not substantially greater than forty-five degrees. The assembly motor, which has a drive arm connected to a lift arm of the micro-mechanical device, completes the lift. One such dual-stage assembly system is disclosed by Reid et al. In "Automated Assembly of Flip-Up Micromirrors," Transducers '97, Int'l Conf. Solid-State Sensors and Actuators, pp. 347–50 (1977).

The dual-stage assembly system is complex, however, thereby increasing the cost of chips containing MEMS and MOEMS devices assembled thereby. As such, there is a need for a single-stage assembly system for micro-mechanical devices capable of rotating a hinged plate as much as ninety degrees out-of-plane.

SUMMARY OF THE INVENTION

A single-stage assembly system capable of rotating a micron-sized hinged plate up to about ninety degrees "out-of-plane" is disclosed. The single-stage assembly system consists of a beam having a first end that is movable in an upwardly-directed arc away from a support surface. A first angled edge depends from the first end of the beam. Also included is an actuator operable to apply a force to the beam. The single-stage assembly system further includes a second angled edge formed within a region of a hinged plate.

When unassembled, the beam and hinged plate lie flat on the support surface, i.e., substrate. At least a portion of the first angled edge depending from the beam lies beneath the second angled edge of the hinged plate. In response to the applied force from the actuator, the first end of the beam moves upwardly away from the substrate. Upon such upwardly-directed movement, the first angled edge pulls the hinged plate off of the substrate, with the first and second angled edges sliding over one another. The angle or taper of the angled edges advantageously provide a mechanical advantage suitable for rotating the hinged plate up to about ninety degrees out of the plane of the substrate in a single step.

Angles in the range of about fifteen to about forty degrees for the first angled edge, and between about twenty-five and forty degrees for the second angled edge have been found to be suitable for providing the necessary mechanical advantage for single-stage, ninety degree out-of-plane rotation, for the forces applied and the configurations shown herein.

A variety of actuators and actuation forces can be used in conjunction with the present single-stage assembly system. For example, the required upwardly-directed force can be applied by using thermal contraction of beam layers, beam contraction due to release of intrinsic residual strains, electrostatic forces, electromagnetic forces, capillary forces, and external mechanical forces. The configuration of the beam may vary as a function of the actuator used.

BRIEF DESCRIPTION OF THE DRAWINGS

Further features of the invention will become more apparent from the following detailed description of specific embodiments thereof when read in conjunction with the accompany drawings in which.

DETAILED DESCRIPTION

The present invention relates to a single-stage self-assembly system for micron-sized mechanical structures. Technology for fabricating such structures and the present single-stage self-assembly system is available from MEMS Technology Application Center at North Carolina (MCNC) under the Defense Advanced Research Projects Agency (DARPA)-supported Multi-User MEMS Processes (MUMPs).

MCNC MUMPs technology is a three-polysilicon-layer surface-micromachining process. The lowest polysilicon layer, POLY0, is non-releasable and is used to patterning address electrodes and local wiring on a substrate, such as a silicon wafer or chip. The upper two polysilicon layers, POLY1 and POLY2 are releasable to form mechanical structures. Such release is achieved by etching away sacrificial oxide layers deposited between the polysilicon layers during fabrication. The polysilicon and oxide layers are individually patterned, and unwanted material from each layer is removed by reactive ion etching before the next layer is added.

Typically, to fabricate a micron-sized mechanical structure using MUMPs technology, a variety of hinged-plates of differing size and shape, and disposed in specific locations on a substrate, are formed. Forming such hinged plates is known in the art. See, Pister et al., "Microfabricated Hinges," vol. 33, Sensors and Actuators A, pp. 249–56, 1992. See also assignee's co-pending patent applications MICRO MACHINED OPTICAL SWITCH, filed May 15, 1997 as Ser. No. 08/856,569 and METHODS AND APPARATUS FOR MAKING A MICRODEVICE, filed May 15, 1997 as Ser. No. 08/856,565, both of which applications are incorporated by reference herein.

As formed, the hinged plates lie flat on the surface of the substrate. Thus, assembling a structure from such plates requires rotating them, about their hinges, out of the plane of the substrate. Typically, some of the hinged plates will be rotated by ninety degrees, and others by a lesser amount. The single-stage assembly device described herein is suitable for achieveing rotations of up to and including about ninety degrees.

As used herein, the term "self-assembly" refers to a process by which a plurality of micro-mechanical devices can be fabricated based on a single intervention to apply an actuating force. The terms "out of plane" and the like, and "vertical," reference a direction or location relative to the surface of a substrate upon which the hinged plates reside. In some embodiments, the plates may actually reside on a layer disposed on the substrate, so that "out of plane" should be understood to mean out of a plane parallel to the surface of the substrate. Also, as used herein, the terms "microstructure" or "micro-mechanical device" or the like refers to any micron-sized mechanical, opto-mechanical, electro-mechanical or opto-electro-mechanical device.

Figure 1:
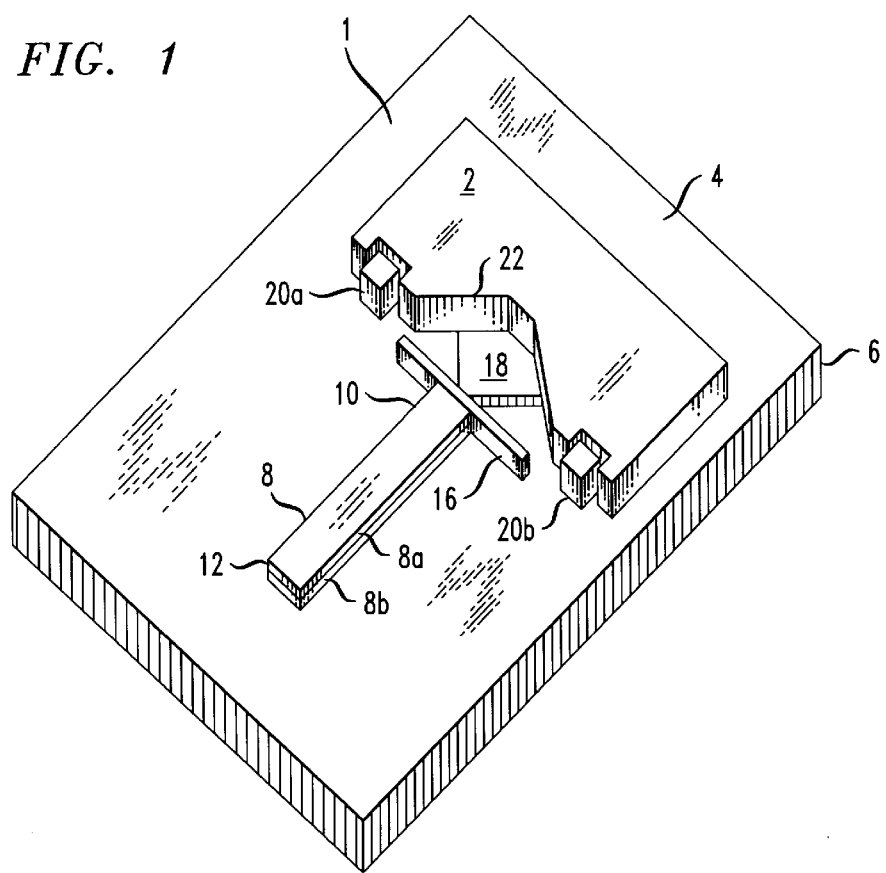
FIG. 1 shows a first exemplary embodiment of a chip containing a self-assembling micro-mechanical device according to the present invention.

FIG. 1 shows a first embodiment of a self-assembling micro-mechanical device 1 according to the present invention. The self-assembling micro-mechanical device 1 includes a single-stage self-assembly system and a hinged plate 2. The self-assembling micro-mechanical device 1 is disposed on a portion of a surface 4 of a substrate 6. The device 1 is shown unassembled in FIG. 1, wherein the various structures comprising the device are lying flat on the surface 4.

The single-stage self-assembly system includes a beam 8 having a "free" first end 10 that is movable out of the plane of the surface 4 when suitably actuated. In the exemplary embodiment shown in FIG. 1, the beam 8 is attached, at a second end 12, to the surface 4 at an anchor point, not shown, located underneath the second end 12 of beam 8. In some embodiments, the second end 12 of the beam 8 is anchored to an underlying layer of material, not shown, disposed on the surface 4. A stop 16, shown in FIG. 1 as a bar, depends laterally from the first end 10 of the beam 8. A first engagement member 18, which, in the embodiment shown in FIG. 1, has a v-shape, depends from the stop 16. The single-stage self-assembly system also includes a second engagment member 22, which, in the embodiment shown in FIG. 1, is a v-shaped notch formed in the hinged plate 2.

The hinged plate 2 is rotatably-attached to the surface 4 via two hinges 20a, 20b. It should be understood that in other embodiments, a different amount of hinges can be used for rotatably-attaching a plate to a substrate. Typically, a relatively larger plate will require more hinges than a relatively smaller plate. Before assembly, a portion of the first engagement member 18 lies beneath the hinged plate 2.

Figure 2:
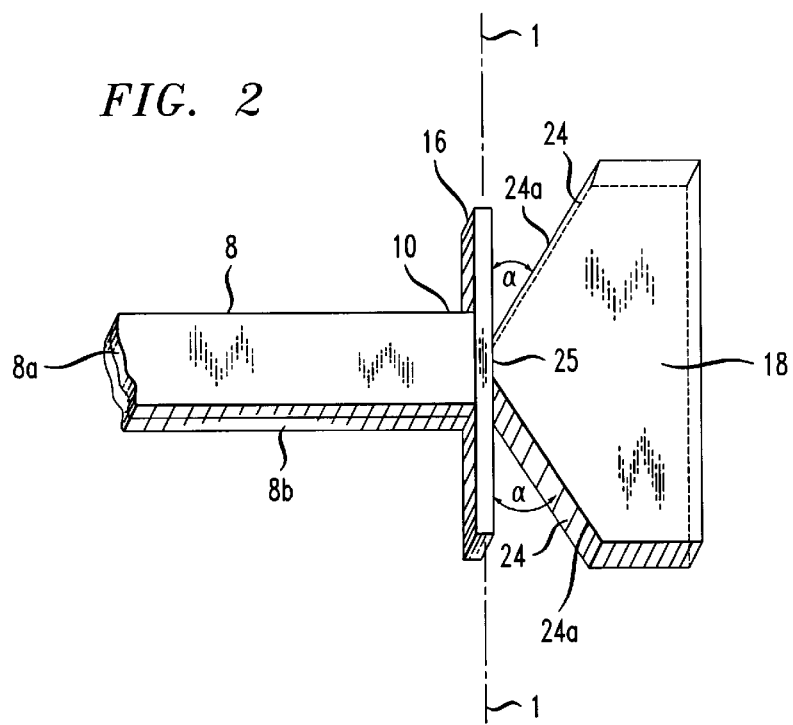
FIG. 2 shows an illustration of angled edges of the lifting member of FIG. 1.

The first engagement member 18 is shown in greater detail in FIG. 2. In the exemplary embodiment shown in FIG. 2, the first engagement member 18 has a first angled surface 24 having a first angled edge 24a. Moreover, in the present embodiment, the first angled surface 24 and angled edge 24a are each comprised of a first and a second portion defining opposed sides of the v-shaped first engagement member 18.

Figure 3:
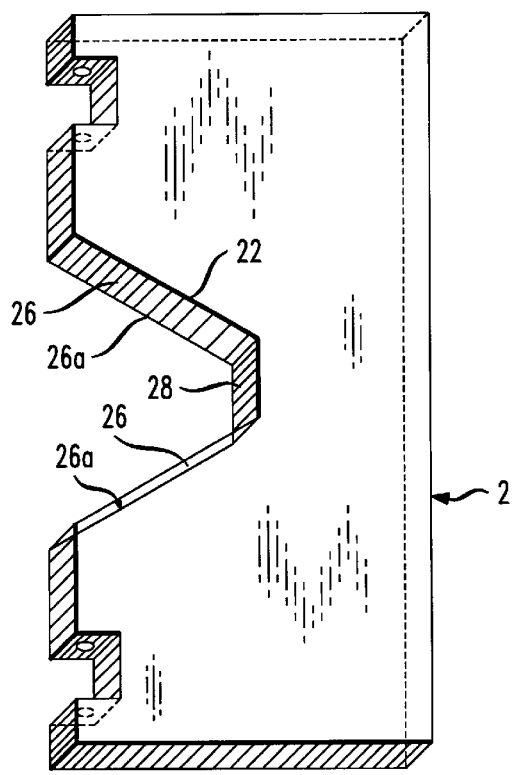
FIG. 3 shows angled edges of the micro-mechanical device of FIG. 1.

Additional detail of the second engagement member is shown in FIG. 3. In the exemplary embodiment shown in FIG. 3, the second engagement member has a second angled surface 26 having a second angled edge 26a. Furthermore, in the embodiment shown in FIG. 3, the second angled surface 26 and second angled edge 26a are each comprised of a first and a second portion defining opposed sides of the v-shaped notch which, in the present embodiment, defines the second engagement member 22.

Figure 4:
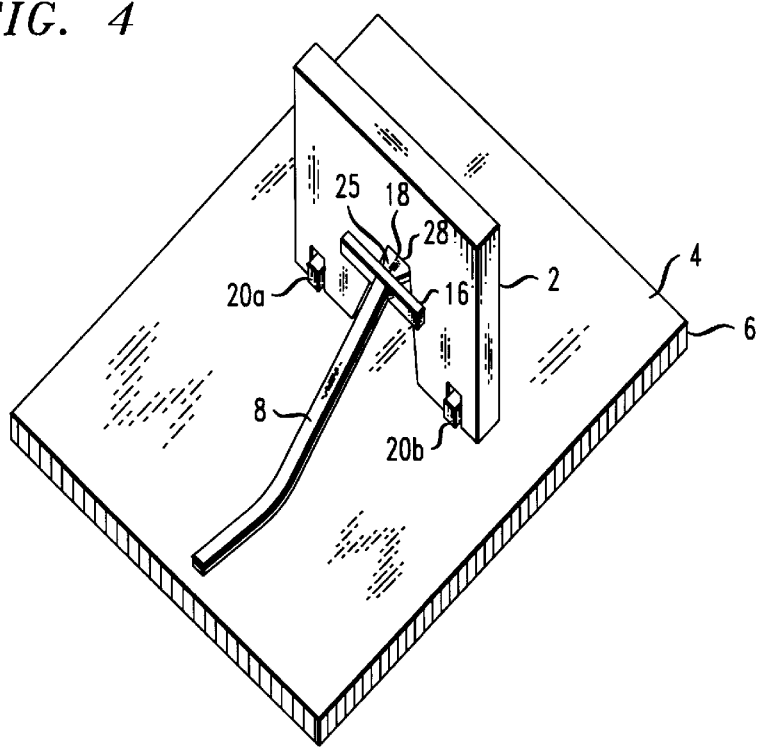
FIG. 4 show the assembled micro-mechanical device of FIG. 1.

When suitably actuated, the first end 10 of the beam 8 moves upwardly, substantially in an arc, out of the plane of the substrate. The continuing upwardly-directed force causes the first angled edge 24a and the second angled edge 26a to slide over one another and the hinged plate 2 to rotate out of the plane of the substrate about its hinges 20a, 20b. With continued upwardly-directed force, the vertices 25, 28 of the respective first and second engagement members 24, 26 substantially converge. At such substantial convergence, the hinged plate is substantially perpendicular to the substrate 6, having been rotated about ninety degrees out-of-plane, as illustrated in FIG. 4. The stop 16 prevents the hinged plate from "flipping over" and falling back towards the substrate on top of the beam 8.

Although not shown in the Figures, the hinged plate 2 can be locked into an upright position in a variety of ways. For example, in one embodiment, a second hinged plate having a direction of rotation orthogonal to the rotation of hinged plate 2 is situated near the hinged plate 2. The second hinged plate, which has a slot for receiving an edge of the standing hinged plate 2, is rotated toward the hinged plate 2. When the slot receives the edge of the hinged plate 2, both plates are effectively locked into position. Once locked into position, adhesive can be applied at the hinges of the hinged plates for a more robust lock. Such methods are illustrated and described in more detail in the assignee's aforementioned patent application Ser. No. 08/856,569 and assignee's patent application entitled METHOD FOR FORMING MICRON-SIZED AND SMALLER LIQUID DROPLETS, filed May 15, 1996 as Ser. No. 08/856,566.

The present single-stage self-assembly system also includes an actuator for providing the force necessary to lift the first end 10 of the beam 8 off of the surface 4. A variety of actuation methods can be used in conjunction with the present invention. In the embodiment shown in FIGS. 1, 2 and 4, the beam 8 itself is the actuator. In such embodiments, the beam 8 comprises two or more layers. For example, the beam may comprise two layers, including a lower layer 8b proximal to the substrate 6 and an upper layer 8a disposed on the layer 8b. Typically, the lower layer 8b is polysilicon, the layer 8b having a thickness of about 1.5 microns. In a first embodiment, each of the layers 8a, 8b have different coefficients of linear thermal expansion. In particular, the upper layer 8a has a greater coefficient of linear thermal expansion than the lower layer 8b. Upon cooling, such as by placing in a freezer, the upper layer 8a contracts to a greater degree than the lower layer 8b, generating an upwardly directed force.

In a second embodiment, the residual strain properties of certain materials can used to develop actuation force. In such an embodiment, the upper layer 8a comprises a material characterized by a high intrinsic strain associated with deposited films, an optional middle layer, if present, comprises a second material having a high intrinsic strain, and the lower layer 8b is again polysilicon, to a thickness of about 1.5 microns. The beam is "released," wherein a sacrificial layer of silicon dioxide is etched away, such as by HF. When the sacrificial layer is removed, the upper layer 8a and optional middle layer contract to minimize residual stress, imparting an upwardly-directed force to the first end 10 of the beam 8. Materials suitable for use as the upper and optional middle layers include, without limitation, silicon nitride, gold, chromium or other metals.

Figure 5:
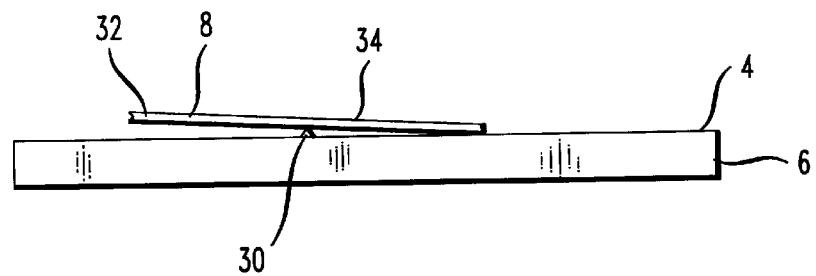
FIG. 5 shows the movable beam suspended at a pivot point.

In other embodiments, other actuators and actuation forces are used. For such other embodiments, however, the configuration of the beam 8 is altered. One such altered configuration is shown in FIG. 5, wherein the beam 8 rests on a pivot point 30. The pivot point, 30 is attached to the substrate 6 or the POLY0 layer. The pivot point 30 divides the beam into a first portion 32 and second portion 34. Actuation involves applying a downwardly-directed force to the first portion 32 of the beam 8. Due to the pivot member 30, as the first portion 32 of the beam 8 moves downwardly, the second portion 34 of the beam 8 moves upwardly, in the manner of a "see-saw" or "teeter."

In a first embodiment for use with a pivoted-beam such as is illustrated in FIG. 5. a liquid is used as an actuator and capillary action is used as an actuation force. In such an embodiment, liquid, such as water or any other conveniently-obtained liquid, is placed in contact with the surface 4 of the substrate 6. The liquid flows underneath the raised first portion 32 of the beam 8. As the liquid drains from the surface 4, the first portion 32 of the beam 8 is drawn downwardly, via capillary action, towards the surface 4. As the first portion 32 drops, the second portion 34 of the beam 8 rises causing the previously-described sliding engagement of the first engagement member 18 and the second engagement member 22. Typically, a wash step is performed after a sacrficial oxide etch. Such a wash can provide the liquid for actuation as described above.

In a second embodiment for use with a pivoted-beam, electrostatic forces can actuate the beam 8. In such an embodiment, a structure capable of generating a downwardly-directed force of suitable magnitude is mechanically linked to the first portion 32 of the beam 8. As previously described, as the first portion 32 moves downwardly, the second portion 34 of the beam 8 moves upwardly engaging and raising the hinged plate 2. An example of structure suitable for generating such a downwardly-directed force is described in the present assignee's aforementioned patent application Ser. No. 08/856.569. Briefly, the structure described therein comprises a vertically-movable conductive plate that is suspended over a conductive region. As a voltage is applied across the plate and conductive region, the conductive plate moves downwardly towards the conductive region. A linkage from the conductive plate to the beam 8 imparts the downwardly-directed force to the first portion 32 of the beam 8, thereby causing the second portion 34 of the beam 8 to rise.

In a third embodiment for use with a pivoted beam, electromagnetic force can be used for actuation. In one embodiment, an actuator employing such force is configured similarly to the actuator utilizing electrostatic forces. Rather than applying a voltage, current loops are established generating magnetic fields to attract a suspended, vertically-movable plate towards the substrate 6.

In a fourth embodiment for use with a pivoted beam, external mechanical forces can be used to actuate the beam 8. Such forces, as may be applied by a microprobe or the like, are used to push the first portion 32 of the beam 8 down towards the substrate 6. It should be understood that for commercial-scale assembly, a device incorporating a plurality of appropriately located microprobes would be used for simultaneous assembly of a plurality of micro-devices.

Figure 6:
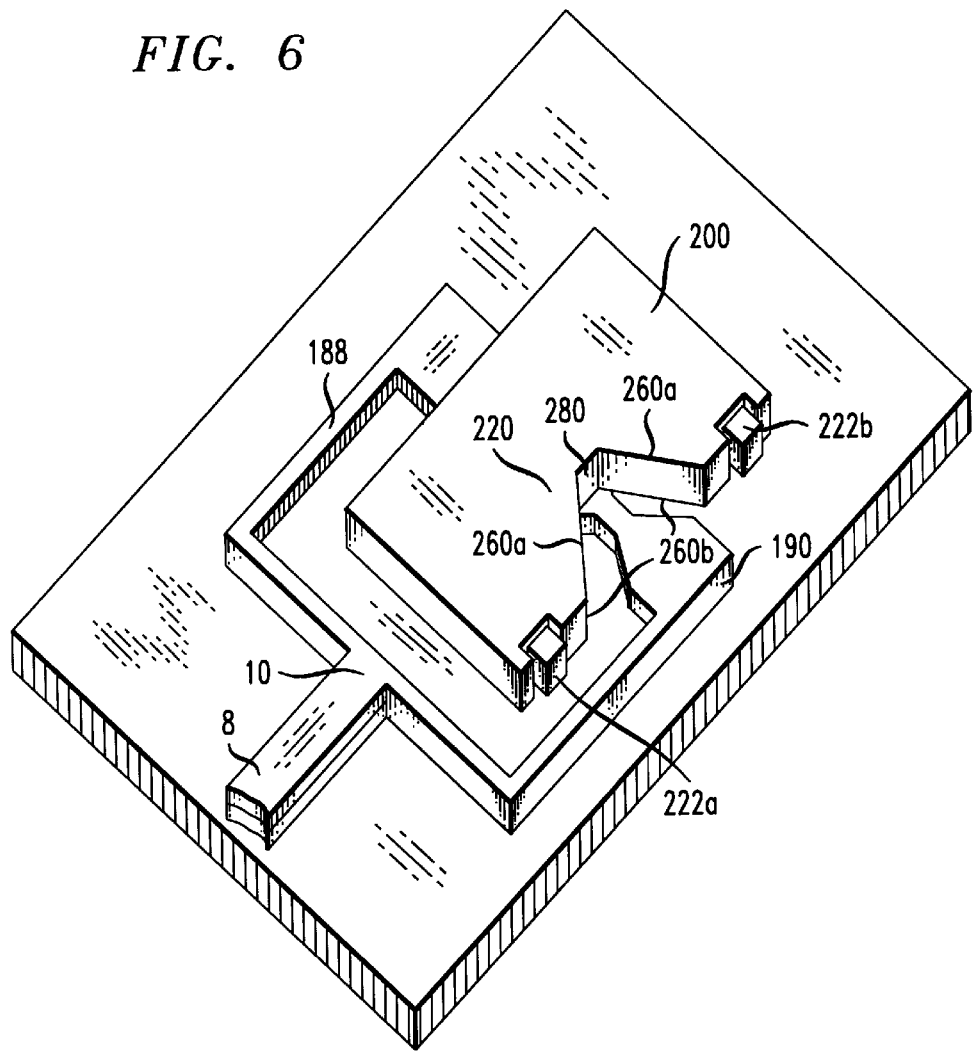
FIG. 6 shows a second exemplary embodiment of a chip containing a self-assembling micro-mechanical device according to the present invention.

FIG. 6 shows a second embodiment of a self-assembling micro-mechanical device 100 according to the present invention. The device 100 is shown unassembled in FIG. 6, wherein the various structures comprising the device are lying flat on the surface 4 of the substrate 6.

Figure 7:
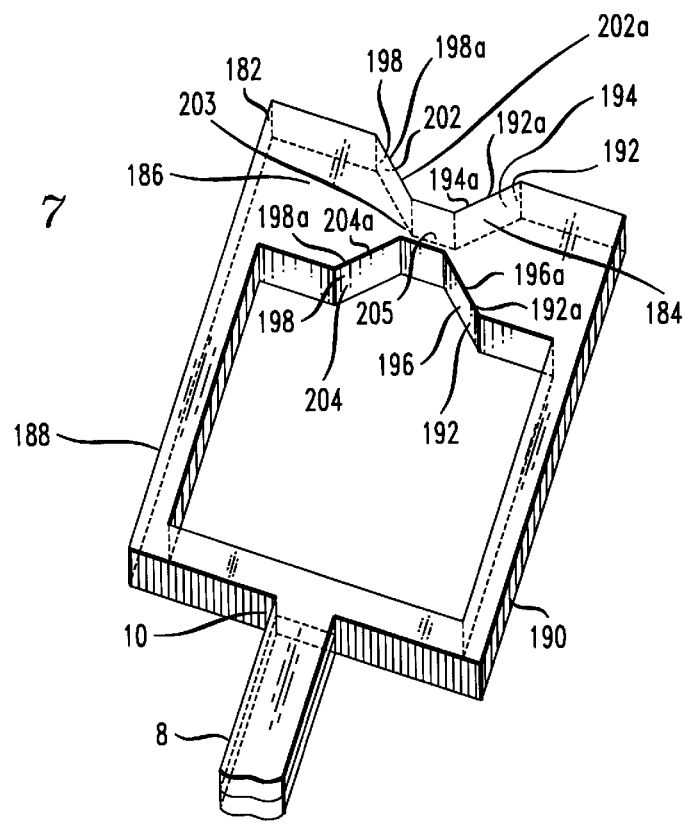
FIG. 7 shows angled edges of the lifting member shown in FIG. 5.
Figure 8:
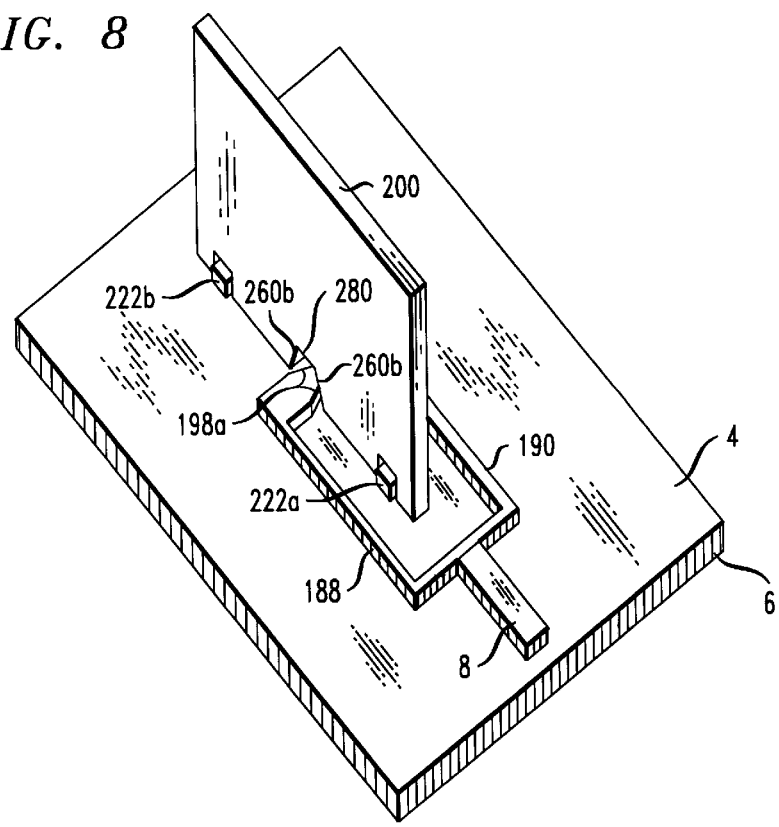
FIG. 8 shows an illustration of the assembled micro-mechanical device of FIG. 5.

As shown in FIGS. 6–8, first engagement member 180 has a different configuration than the first engagement member 18 shown in FIGS. 1, 2 and 4. The second engagment member 22, formed in a portion of hinged plate 200, is configured in the manner of first embodiment shown in FIGS. 1, 3 and 4. The direction of rotation of the hinged plate 200 is, however, orthogonal to the direction of rotation of the hinged plate 2.

Referring to FIG. 7, the first engagment member 180 has a first and second v-shaped widenings 184, 186 formed in a member 182. The member 182 depends from the first end 10 of the beam 8 via arms 188, 190. In the exemplary embodiment shown in FIGS. 7–9, the first widening 184 has a first angled surface 192 having a first angled edge 192a. In the embodiment shown in FIGS. 7–9, the first angled surface 192 is comprised of a first portion 194 and a second portion 196 defining opposed sides of the first v-shaped widening 184. The first angled edge 192a is likewise comprised of a first portion 194a and a second portion 196a. In the present embodiment, the second v-shaped widening 186 has the same configuration as the first v-shaped widening 184. The second v-shaped widening 186 has a third angled surface 198 having a third angled edge 198a. The third angled surface 198 is comprised of a first portion 202 and a second portion 204 defining opposed sides of the second v-shaped widening 186. The third angled edge 198a is comprised of a first portion 202a and a second portion 204a.

When suitably actuated, the first end 10 of the beam 8 moves upwardly out of the plane of the substrate 6. For a hinged plate 200 lying towards the left of its hinges 222a, 222b as shown in FIG. 6, the continuing upwardly-directed force causes the third angled edge 198a of the first engagement member 180, and a second angled edge 260b of the second engagement member 220 to slide over one another. Such sliding engagement causes the hinged plate 200 to rotate out of the plane of the substrate about its hinges 222a, 222b. With continued upwardly-directed force, the narrowing or vertex 203 of the first engagement member 180 and the vertex 280 of the second engagement member substantially converge. At such substantial convergence, the hinged plate 200 is substantially perpendicular to the substrate 6, having been rotated about ninety degrees out-of-plane, as illustrated in FIG. 8.

If, rather than lying to the left, the hinged plate 200 was lying to the right of the hinges 222a, 222b, then the first angled edge 192a of the first engagement member 180 and a fourth angled edge 260a of the second engagement member 220 would engage to raise the hinged plate 200.

The second embodiment of the self-assembling micro-mechanical device 100 shown in FIGS. 6–8 can be actuated in the same manner as described above for the first embodiment of self-assembling micro-mechanical device 1, including using the pivot member 30.

In the embodiments illustrated herein, the first and second engagement members are shown to be v-shaped, so that there is engagement between the first and second engagement members on both sides of the "v." For example, in FIG. 6, both the first portion 202a and the second portion 204a of the angled edge 198a engage the two angled edges that collectively define the angled edge 260b of the second engagement member 220. In other embodiments, the first and second engagment members comprise only a single angled surface and a single angled edge. For clarity of illustration, only a single hinged plate and accompanying single-stage self-assembly system are shown in the Figures. Such a single hinged plate comprises only a portion of complex micro-mechanical devices. It should be understood that for most applications of the present invention, many more hinged plates of varying shapes and sizes, with their accompanying single-stage assembly devices, are disposed in various predetermined locations on a subtrate to fabricate such complex micro-mechanical devices. It will also be appreciated that multiple copies of a micro-mechanical device, or a variety of different devices, can be patterned and assembled on a single chip using the present invention. Moreover, it should be understood that the present self-assembling micro-mechanical devices can be fabricated on chips containing other components, such that, after assembly, the micro-mechanical devices mechanically or optically interact with such other components. Additionally, a chip containing arrays of the present self-assembling micro-mechanical devices be attached to chips containing other devices such that the micro-mechanical devices interact with the other devices.

The invention is further described by the following examples, provided by way of illustration, not limitation.

EXAMPLES

The microstructure lifted in the following examples was a hinged plate having a length of 430 microns and a width of 170 micron. Examples 1–6 were based on the configuration of the single-stage self-assembly system illustrated in FIGS. 1–5. Example 7 was based on the configuration of the single-stage self-assembly system illustrated in FIGS. 6–8. Numerical values ascribed to the various "angled edges" of the engagement members as a "taper" refer to the angle α subtended by an angled surface or edge, such as the angled edge 24a, and the projection of a line located at the vertex or narrowing of the engagement member, such as the axis 1—1, as shown in FIG. 2.

Example 1

The first angled edge of the first engagement member had a taper of 16.5 degrees. The second angled edge of the second engagement member had a taper of 45 degrees. The beam was anchored to the POLY0 layer overlying the surface of the substrate. The beam was formed of an underlying layer of polysilicon 1.5 microns thick, a first overlying layer of chromium, about 300 angstrons thick, disposed on the polysilicon, and a second overlying layer of gold, 0.5 microns thick, disposed on the chromium. Underneath the polysilicon layer was a sacrificial layer of silicon dioxide about 2.75 microns thick. Lift was actuated using the residual strain properties of the gold and chromium layers. Silicon dioxide was removed with HF. The plate rotated ninety degrees about its hinges, coming to rest in a substantially perpendicular orientation relative to the surface of the substrate.

Example 2

The same tapers as above, but the beam was placed on a pivot member rather than anchored at an end. Lift was repeated several times, wherein, substantially perpendicular lift was achieved used different actuating forces including electrostatic force, capillary action and external mechanical force. For actuation by capillary action, isopropyl alcohol was used. For actuation by external mechanical force, a microprobe was used to apply downward force to the beam.

Example 3

The experiment of Example 1 was repeated but the first angled edge of the first engagement member had a taper of 25 degrees. The plate was lifted to a perpendicular orientation.

Example 4

The experiments of Example 2 were repeated but the first angled edge of the first engagement member had a taper of 25 degrees. The plate was lifted to a perpendicular orientation.

Example 5

The experiment of Example 1 was repeated but the first angled edge had a taper of 28 degrees and the second angled edge of the second engagement member had a taper of 23 degrees. The plate was lifted to a perpendicular orientation.

Example 6

The experiments of Example 2 were repeated but the first angled edge of the first engagement member was 28 degrees and the second angled edge of the second engagement member was 23 degrees. The plate was lifted to a perpendicular orientation.

Example 7

The tapers of the cooperating angled edges were 40 degrees for both the first and the second engagement members. The plate was lifted to a perpendicular orientation using the actuation method described in Example 1.

Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention.

We claim:

1. A chip comprising:

a substrate having a surface;

a beam having a first end movable in an arc away from the surface of the substrate, wherein a first engagement member having a first angled edge depends from the first end of the beam, and further wherein the beam is movable between first and second positions; and a microstructure rotatably attached to the surface of the substrate and having a second engagement member having a second angled edge; and an actuator operable to apply a force to the beam that causes the first end of the beam to move; wherein, in the first position, the microstructure and the movable beam are disposed in substantially superposed and parallel relation to one another and the first surface, and further wherein at least a portion of the first angled edge underlies the second angled edge so that as the first end of the movable beam moves away from the surface of the substrate upon actuation, the first angled edge and the second angled edge slidingly engage one another; and wherein, in the second position, the first end of the beam has moved away from the surface of the substrate a sufficient amount such that, in conjunction with the sliding engagement of the first and second angled edges, the microstructure is rotated substantially more than 45 degrees away from the surface of the substrate.

2. The chip of claim 1, wherein the second angled edge is characterized by a taper in the range of about 25 to about 40 degrees.

3. The chip of claim 1, wherein the taper of the first angled edge is in the range of about 15 to about 40 degrees.

4. The chip of claim 1, wherein the first engagement member comprises two edges obversely depending from the first end of the movable beam, at least one of which edges is the first angled edge.

5. The chip of claim 1, further comprising a stop depending from the first end of the beam, the stop configured to engage the microstructure to terminate rotation thereof.

6. The chip of claim 1, wherein the first engagement member comprises two v-shaped widenings, each widening defined by two angled edges, at least one of which edges of one widening for engaging the second angled edge of the second engagement member.

7. The chip of claim 6, wherein the one angled edge is characterized by a taper in the range of about 25 to about 40 degrees.

8. The chip of claim 1 wherein a second end of the beam is secured to a layer in contact with the surface of the substrate.

9. The chip of claim 8, wherein the beam comprises a first and a second layer, which layers comprise the actuator, wherein the second layer is proximal to the substrate and the first layer is disposed on the second layer.

10. The chip of claim 9, wherein the first layer is characterized by a first coefficient of linear thermal expansion and the second layer is characterized by a second coefficient of linear thermal expansion, wherein the first coefficient of linear thermal expansion is greater than the second coefficient of linear thermal expansion.

11. The chip of claim 9, wherein the first layer is comprised of a material having a relatively large amount of intrinsic residual strain.

12. The chip of claim 1, wherein the beam is disposed on a pivot member.

13. The chip of claim 12, wherein a first portion of the beam is defined between the pivot member and the first end of the beam, and a second portion of the beam is defined between the pivot member and a second end of the beam, and further wherein, the actuator is operable to apply a downwardly directed force to the second portion of the beam.

14. The chip of claim 13, wherein the actuator comprises a conductive region disposed on the substrate, and further comprises a conductive plate suspended above the conductive region and mechanically linked to the second portion of the movable beam.

15. The chip of claim 13, wherein the actuator comprises a liquid disposed on the first surface of the substrate, and means for removing the liquid.

16. The chip of claim 13, wherein the actuator comprises a mechanical member mechanically linked to the second portion of the movable beam.

17. A method for self-assembly of a micro-mechanical device comprising at least one hinged plate having at least one hinge and rotateably attached to, and disposed substantially in the plane of, a support, comprising the steps of:

providing a first angled edge mechanically linked to an actuator, the first angled edge disposed substantially in the plane of a support and beneath the hinged plate;

applying an actuating force to the first angled edge causing it to lift and move in an arc away from the support; and contacting the first angled edge with a second angled edge of the hinged plate, wherein, upon contact, the first angled edge lifts the overlying hinged plate, the first and second edges sliding over one another providing a mechanical advantage sufficient for rotating the hinged plate about the hinge and away from the support substantially more than 45 degrees.

18. The method of claim 17 wherein the hinged plate is rotated about 90 degrees away from the support.

19. The method of claim 17, wherein the first angled edge is characterized by a taper in the range of about 15 to about 40 degrees.

20. The method of claim 17, wherein the second angled edge is characterized by a taper in the range of about 25 to about 40 degrees.

* * * * *